United States Patent [19]
Lee

[11] Patent Number: 5,663,920
[45] Date of Patent: Sep. 2, 1997

[54] SEMICONDUCTOR MEMORY WORD LINE DRIVER CIRCUIT

[76] Inventor: Seung-Keun Lee, No. 349-23, Myeonmok 4-dong, Jungrang-gu, Seoul, Rep. of Korea

[21] Appl. No.: 661,109

[22] Filed: Jun. 10, 1996

[30] Foreign Application Priority Data

Jun. 9, 1995 [KR] Rep. of Korea .................. 95-15213

[51] Int. Cl.$^6$ ................................ G11C 13/00
[52] U.S. Cl. .................. 365/226; 365/227; 365/230.06
[58] Field of Search ............................ 365/226, 227, 365/230.06, 230.01

[56] References Cited

U.S. PATENT DOCUMENTS 5,193,073  3/1993  Bhuva ........................ 365/226
5,473,576  12/1995  Matsui ...................... 365/230.06

Primary Examiner—Terrell W. Fears
Attorney, Agent, or Firm—Marger Johnson McCollom & Stolowitz P.C.

[57] ABSTRACT

A driving circuit having an output terminal includes an input terminal coupled to a first control signal; a first transistor having a current path connected between a pumping voltage and the output terminal and having a control electrode coupled to the first control signal; a second transistor having a current path connected to the output terminal and having a control electrode coupled to the first control signal; and a node connected to the output terminal through the current path of the second transistor and being responsive to a second control signal.

13 Claims, 2 Drawing Sheets

SEMICONDUCTOR MEMORY WORD LINE DRIVER CIRCUIT

BACKGROUND OF THE INVENTION

1. Field of the Invention

The present invention relates to semiconductor memory devices, and more particularly to improved circuits for use in a semiconductor memory device for driving a word line control signal.

The present application claims priority based on Korean Patent Application Serial No. 15213/1995 which is incorporated herein by reference for all purposes.

2. Description of the Related Art

Generally, known semiconductor memory devices use a high voltage, sometimes called a pumping voltage (hereinafter referred to as "VPP"), which is obtained by boosting the usual power supply voltage VCC, in order to improve speed of operation. In order to increase the current provided to memory cells or to compensate for a voltage drop as high as the threshold voltage (hereinafter referred to as a "VT") of an NMOS transistor of each memory cell, the pumping voltage VPP, preferably as high as VCC+VT, is provided in the semiconductor memory device.

"Bootstrap" circuits are known in the art for obtaining the pumping voltage VPP. In such circuits, the current consumed by the pumping voltage VPP is supplemented by the bootstrap method, thereby enabling a constant pumping voltage VPP. The greater the current consumed by the pumping voltage VPP, the greater the compensating current supplied by the bootstrap method. This requires an increase of the charge pump capacitance of the bootstrap circuit, causing an increase of the circuit size.

FIG. 1 is a circuit diagram showing a word line driver circuit according to the prior art, for driving word line control signals S1–S16. The word line drivers typically are part of a semiconductor RAM row decoder, which asserts one word line at a time in response to address input bits. Referring now to FIG. 1, first input signals /φK1–/φK16 exhibit the pumping voltage level VPP in the logic "high" state, and second input signals φK1–φK16 exhibit the supply voltage level VCC in the logic "high" state. Each of PMOS transistors T1 to T16 has is gate connected to a corresponding one of the first input signals and its source connected to the pumping voltage source VPP and its drain connected to a corresponding one of nodes N1 to N16.

Each of the NMOS transistors T17 to T32 has its gate connected to a corresponding one of second input signals φK1–φK15, its source connected to a ground voltage VSS and its drain connected to a corresponding one of the nodes N1 to N16. Each of the PMOS transistors T1 to T16 thus is connected in series with a corresponding one of the NMOS transistors T17 to T32 between the pumping voltage source VPP and the ground potential VSS. Each of the word line control signals S1 to S16 is output from a respective one of nodes N1 to N16 to the corresponding word line. Each drain of the PMOS transistors T1 to T16 and each drain of the NMOS transistors T17 to T32 are connected in common at the corresponding node N1 to N16, respectively. In operation, a word line control signal of logic "low" level is applied to a selected one of the word lines, whereas the remaining word line control signals of logic "high" levels are applied to the unselected word lines. For example, where the input signals select S16, the word line control signals S1 to S15 which are to be applied to the unselected word lines go from logic "low" levels to logic "high" levels, whereas the word line control signal S16 maintains a logic "low" level. In other words, the word line control signals S1 to S16 are active low.

FIG. 2 is a timing diagram of the word line control signals corresponding to the circuit of FIG. 1 in normal operation. In this illustration, the input signals together select the word line control signal S16. Referring to FIG. 2, the second input signals φK1–φK15 transition from the power supply voltage VCC levels to logic "low" levels, thus turning the NMOS transistors T17 to T31 OFF. Input signal φK16 remains low. The first input signals, on the other hand, go from the pumping voltage VPP levels to logic "low" levels, thus turning the PMOS transistors T1 to T15 ON. Input signal /φK16 remains at VPP. Consequently, the word line control signals S1 to S15 are pulled up from logic "low" levels to the pumping voltage VPP levels. Assuming that the capacitance required in charging a word line control signal S1 is C1, the voltage swing of the word line control signal S1 is ?VPP and the charge amount required from the pumping voltage source VPP to the word line control signal S1 is Q1, the charge amount Q1=C1 *?VPP. Where the number of the word line control signals S(i) is N, the total charge amount Qtot=Q1*N=(C1*)*N. The problem with this arrangement is the pumping voltage source VPP has to provide essentially the total charge amount Qtot to drive the word lines. This problem is exacerbated as DRAM devices, for example, grow to larger capacities, thereby requiring greater numbers of word lines and/or increases in word line length.

SUMMARY OF THE INVENTION

It is therefore an object of the present invention to provide an word line driver circuit which can reduce power consumption by reducing the total charge amount required, and thus reduce the pump capacitance required of the pumping voltage source.

One aspect of the invention includes a circuit for selectively driving a series of word line control signals in a semiconductor memory device. The memory has a power supply node VCC and has a pumping voltage source VPP to provide a pumping voltage greater than the power supply voltage VCC. The new circuit includes a series of input terminals for receiving a series of input signals for selectively asserting one at a time of the word line control signals. A series of PMOS transistors are provided, each PMOS transistor being arranged so as to provide a controlled current path between the pumping voltage source VPP and a corresponding output terminal. Each output terminal provides a corresponding word line control signal. Each PMOS transistor has its gate terminal coupled to a corresponding one of the input terminals to receive the corresponding input signal. A series of NMOS transistors also are provided, each NMOS transistor being arranged in series with a respective one of the PMOS transistors so as to provide a controlled current path between the corresponding output terminal and a common node "A", and each NMOS transistor further having its gate terminal coupled in common with the corresponding PMOS transistor gate terminal to the corresponding input terminal. Charge control means are coupled to the common node A for driving all of the word line control signals to a voltage approximately equal to the pumping voltage less a predetermined threshold voltage prior to selection of one of the word line control signals by the input signals. After all of the word lines are driven to this intermediate voltage, akin to "precharging" the word lines, the input signals select one of the word lines to return to ground (active low state), and the other word lines are boosted up to the pumping voltage VPP. This boosting step requires far less charge than in the prior art, as the change in word line voltage is only a threshold voltage VT (see FIG. 4).

BRIEF DESCRIPTION OF THE DRAWINGS

These and various other features and advantages of the present invention will be readily understood with reference to the following detailed description taken in conjunction with the accompanying drawings, in which.

DETAILED DESCRIPTION OF THE PREFERRED EMBODIMENT

The present invention will now be described more fully with reference to the accompanying drawings, in which a preferred embodiment is shown. It should be noted that the same parts or elements of the drawings represent the same number or symbol wherever possible.

Figure 1:
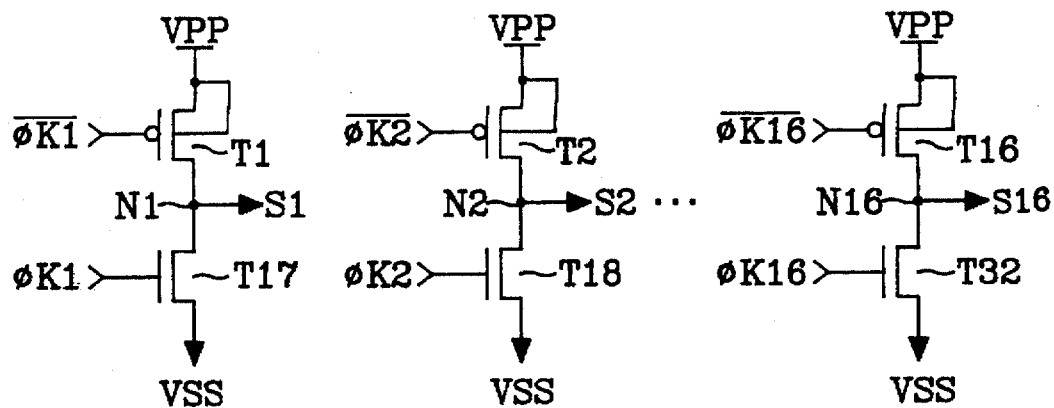
FIG. 1 is a circuit diagram showing a word line driver circuit according to the prior art.
Figure 2:
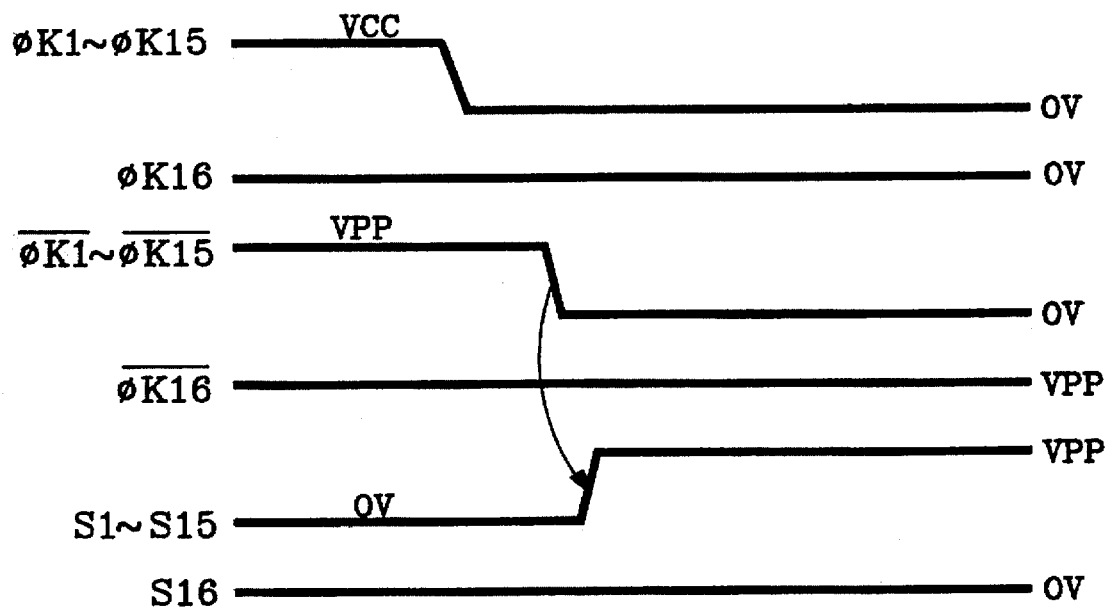
FIG. 2 is a timing diagram illustrating operation of the circuit of FIG. 1.
Figure 3:
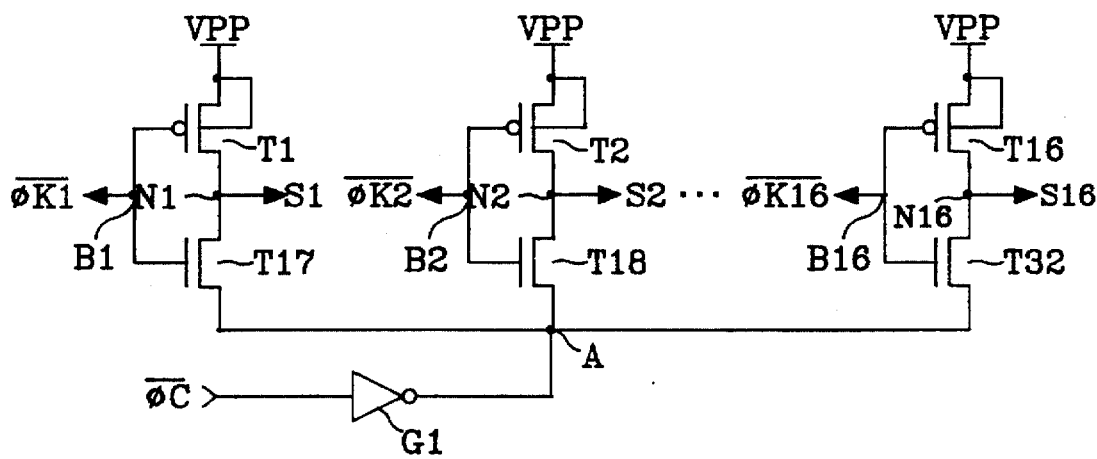
FIG. 3 is a circuit diagram showing an improved word line driver circuit according to the present invention.

FIG. 3 is a circuit diagram showing a driving circuit according to the present invention. Referring to FIG. 3, each of the PMOS transistors T1 to T16 is connected in series with a respective one of the NMOS transistors T17 to T32. Each of the PMOS transistors T1 to T16 has its source connected to the pumping voltage source VPP, its drain connected to a corresponding one of output nodes N1 to N16, and its gate connected to receive a corresponding one of the input signals /φK1 to /φK16. Each of the NMOS transistors T17 to T32 has its drain connected to a corresponding one of the nodes N1 to N16, its source connected to a common node A, and its gate connected to a corresponding one of the input signals in common with the gate of the corresponding series-connected PMOS transistor. The node A is connected to a receive a charge signal/φC through an inverter G1. Each drain of the PMOS transistors T1 to T16 and each drain of the NMOS transistors T17 to T32 are connected in common to respective ones of the nodes N1 to N16 which, in turn, is connected to each of the word line control signals S1 to S16 for driving the word lines.

Figure 4:
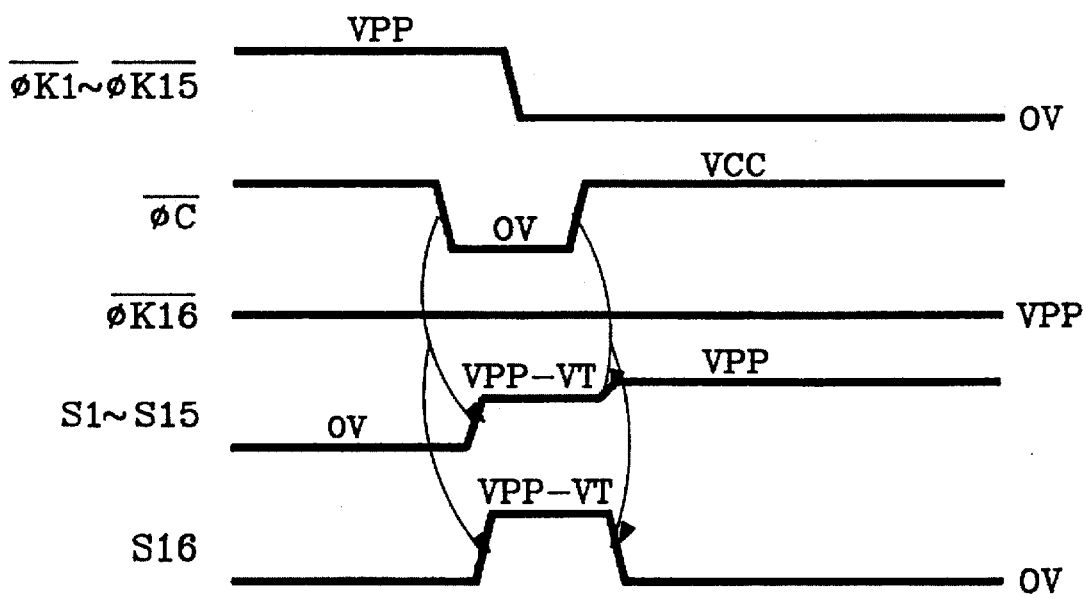
FIG. 4 is a timing diagram illustrating operation of the circuit of FIG. 3.

FIG. 4 is a timing diagram illustrating operation of the driver circuit of FIG. 3. This diagram illustrates operation where the word line control signal S16 is selected. When the charge signal /φC switches from a logic "high" level (VCC) to a logic "low" level, the voltage at node A goes to substantially the power supply voltage VCC level. Consequently, the word line control signals S1 to S16 are pulled up to VPP-VT levels. By charging node A to the power supply voltage VCC before a word line is asserted, the power consumption required to boost the word line control signals S1 to S16 to the pumping voltage VPP is reduced. Since the node A is "precharged" to the power supply voltage VCC, the word line control signals S1 to S16 need only be further boosted to VPP-VT levels to assert them.

In the meanwhile, when the charge signal transits from a logic "low" level to a logic "high" level, the word line control signals S1 to S15 go to the pumping voltage VPP level by the external signals of logic "low" levels, whereas the selected word line, here S16 for illustration, simply relaxes from VPP-VT back down to the logic low level. In this illustration, the total charge amount Qtot supplied from the pumping voltage source VPP connected to the sources of the PMOS transistors T1 to T16 equals to (C1* VT)*N. Thus, the pumping current requirement from the pumping voltage source VPP is reduced to a level merely proportional to the threshold voltage VT. This reduced charge/capacitance requirement will support reduced circuit size and power without compromising speed.

While there has been illustrated and described what is considered to be a preferred embodiment of the present invention, it will be understood by those skilled in the art that various changes and modifications may be made without departing from the scope of the present invention. Therefore, it is intended that the present invention not be limited to the particular embodiment disclosed as the best mode contemplated for carrying out the present invention, but that the present invention includes all embodiments falling within the scope of the appended claims. For example, various different types of transistors can be deployed in a memory circuit within the scope of the predent invention. The numbers of input signals, word lines, etc. is not critical.

I claim:

1. A circuit for selectively driving a word line control signal in a semiconductor memory device having a power supply node VCC and having a pumping voltage source VPP to provide a pumping voltage greater than the power supply voltage VCC, the circuit comprising:

a series of input terminals for receiving a series of input signals;

a series of first transistors each arranged to provide a controlled current path between the pumping voltage source VPP and a respective output terminal to provide a corresponding word line control signal, each first transistor having a respective control electrode coupled to a corresponding one of the input terminals;

a series of second transistors, each second transistor arranged in series with a respective one of the first transistors so as to provide a controlled current path between the output terminal and a common node A, and each second transistor further having a respective control electrode coupled in common with the corresponding first transistor control electrode to the corresponding input terminal; and a charge control signal input terminal for receiving a charge control logic signal, the charge control logic signal being coupled to the common node A for controlling the second transistors in common so as to drive all of the output terminals to a voltage intermediate ground and the pumping voltage in response to the charge control logic signal, thereby reducing a boosting current required to further pull up a selected one of the output terminals to the pumping voltage in response to the corresponding input signal.

2. A circuit according to claim 1, wherein each input signal has a voltage swing substantially from ground to the said pumping voltage.

3. A circuit according to claim 1, wherein the charge control logic signal has a voltage swing substantially from a ground voltage to the power supply voltage VCC of the driver circuit.

4. A circuit according to claim 1, wherein the first transistors and the second transistors comprise MOS devices.

5. A circuit according to claim 1, wherein the first transistors comprise PMOS devices and the second transistors comprise NMOS devices.

6. A circuit according to claim 1, wherein the charge control logic signal is coupled to node A through an inverter.

7. A circuit according to claim 1, wherein the first transistors and the second transistors comprise MOS devices, and the charge control logic signal is coupled to node A through an inverter so as to drive node A to a voltage substantially equal to the pumping voltage VPP minus an MOS threshold voltage VT in response to assertion of the charge control logic signal.

8. A method of selectively driving word line control signals in a semiconductor memory device having a power supply node VCC and having a pumping voltage source VPP that provides a pumping voltage greater than the power supply voltage VCC, the method comprising:

providing a series of input signals, each input signal for selecting a corresponding word line control signal;

providing a charge control signal;

in response to a first transition of the charge control signal, driving all of the word line control signals to an intermediate voltage less than the pumping voltage; and in response to a second transition of the charge control signal, further driving the word line control signals to substantially the pumping voltage except for a selected one of the word line control signals corresponding to an asserted one of the input signals, and returning the selected one of the word line control signals substantially to ground, thereby asserting the selected control signal.

9. A method according to claim 8 wherein said driving all of the word line control signals to an intermediate voltage comprises driving all of the word line control signals to substantially the pumping voltage less a predetermined threshold voltage.

10. A method according to claim 8 further comprising effecting the first transition of the charge control signal, and then effecting the second transition of the charge control signal, and further, asserting a selected one of the input signals in between the first and second transitions of the charge control signal.

11. A method according to claim 8 wherein the input signals are active low, and the word line control signals are active low, and said method includes pulling all of the word line control signals up to the intermediate voltage level in response to the first transition of the charge control signal; and in response to the second transition of the charge control signal, pulling the selected word line control signal down substantially to ground.

12. A circuit for selectively driving a series of word line control signals in a semiconductor memory device having a power supply node VCC and having a pumping voltage source VPP to provide a pumping voltage greater than the power supply voltage VCC, the circuit comprising:

a series of input terminals for receiving a series of input signals for selectively asserting one at a time of the word line control signals;

a series of PMOS transistors, each PMOS transistor arranged to provide a controlled current path between the pumping voltage source VPP and a corresponding output terminal to provide a corresponding word line control signal, each PMOS transistor having a respective gate terminal coupled to a corresponding one of the input terminals to receive the corresponding input signal;

a series of NMOS transistors, each NMOS transistor arranged in series with a respective one of the PMOS transistors so as to provide a controlled current path between the output terminal and a common node A, and each NMOS transistor further having a gate terminal coupled in common with the corresponding PMOS transistor control electrode to the corresponding input terminal; and charge control means coupled to the common node A for controlling the NMOS transistors in common so as to drive all of the word line control signals to a voltage approximately equal to the pumping voltage less a predetermined threshold voltage prior to selection of one of the word line control signals by the input signals.

13. A circuit according to claim 12 wherein the charge control means includes an inverter coupled to node A for selectively driving node A between first and second logic states in response to a charge control input signal coupled to the inverter.

* * * * *